(12) United States Patent
Trimberger

(10) Patent No.: US 7,852,701 B1
(45) Date of Patent: Dec. 14, 2010

(54) CIRCUITS FOR AND METHODS OF DETERMINING A PERIOD OF TIME DURING WHICH A DEVICE WAS WITHOUT POWER

(75) Inventor: Stephen M. Trimberger, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 134 days.

(21) Appl. No.: 12/402,362

(22) Filed: Mar. 11, 2009

(51) Int. Cl.
*G11C 5/14* (2006.01)
*G11C 29/00* (2006.01)

(52) U.S. Cl. .................. 365/228; 365/201; 365/226; 714/718; 714/719

(58) Field of Classification Search .................. 365/228
See application file for complete search history.

(56) References Cited

U.S. PATENT DOCUMENTS

| | | | | |
|---|---|---|---|---|
| 4,422,163 A | * | 12/1983 | Oldenkamp | ................. 365/229 |
| 5,023,874 A | * | 6/1991 | Houston | ..................... 714/719 |
| 5,422,852 A | * | 6/1995 | Houston et al. | ............. 365/201 |
| 6,101,421 A | * | 8/2000 | Goedken et al. | ............. 700/79 |
| 7,111,224 B1 | | 9/2006 | Trimberger | |
| 7,353,374 B1 | | 4/2008 | Trimberger | |
| 7,436,726 B1 | | 10/2008 | Lovejoy | |

OTHER PUBLICATIONS

Lesea, Austin, "IP Security in FPGAs," *WP261 (v.1.0)*, Feb. 16, 2007, pp. 1-9, available from Xilinx, Inc., 2100 Logic Drive, San Jose, California 95124, USA.
Skorobogatov, Sergei, "Low temperature data remanence in static RAM," *Univ. of Cambridge Technical Report No. 536*, Jun. 2002, pp. 1-9, available from University of Cambridge, 15 JJ Thomson Avenue, Cambridge CB3 0FD, United Kingdom.
Tuan, Tim, "Analysis of Data Remanence in a 90 nm FPGA," *Proc. of the 2007 Custom Integrated Circuits Conference*, Sep. 16-19, 2007, pp. 93-96, San Jose, California, USA.

* cited by examiner

*Primary Examiner*—Son L Mai
(74) *Attorney, Agent, or Firm*—John J. King

(57) ABSTRACT

A circuit structure for determining a period of time during which a device was without power is disclosed. The circuit structure comprises a volatile memory storing known data and a test circuit coupled to the volatile memory, the test circuit determining an amount of incorrect data stored in the volatile memory after a period of time during which the device was without power. The amount of incorrect data is used to determine the period of time during which the device was without power. A method of controlling a device based on the amount of incorrect data stored in a volatile memory after the device was without power is also disclosed. For example, the device can be controlled by altering a start-up sequence of one or more elements of the device.

20 Claims, 9 Drawing Sheets

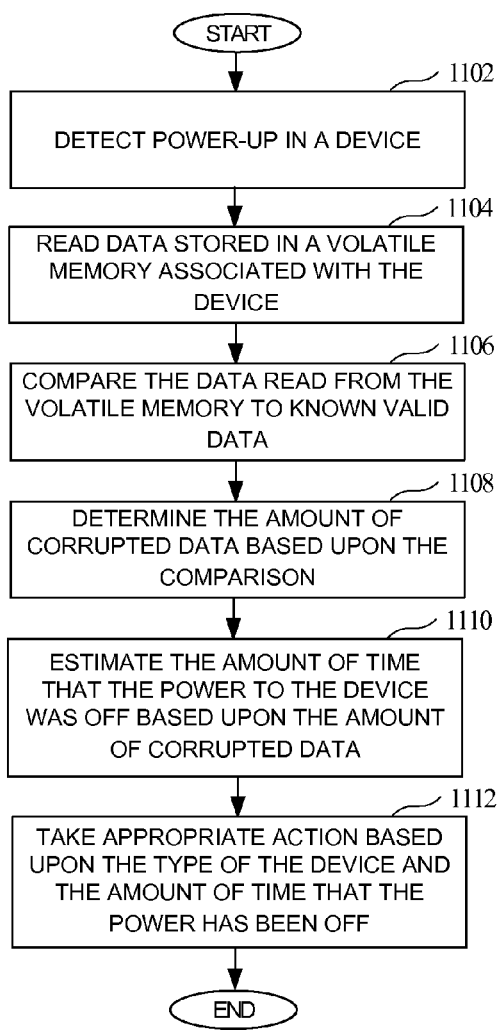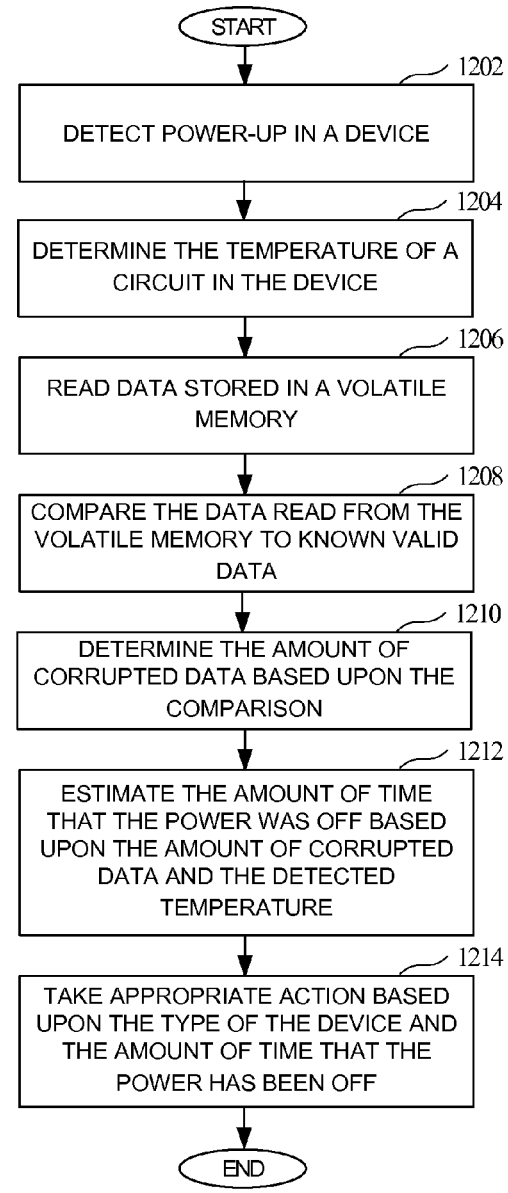

CIRCUITS FOR AND METHODS OF DETERMINING A PERIOD OF TIME DURING WHICH A DEVICE WAS WITHOUT POWER

FIELD OF THE INVENTION

The present invention relates generally to integrated circuits, and in particular, to circuits for and methods of determining a period of time during which a device was without power.

BACKGROUND

Clocks or other timing circuits are often used in electronic systems for enabling the operation of certain features or functions of the electronic systems. Electronic systems lose the time kept by a clock when power is shut off, and the clock will need to be reset. While some electronic systems may have a clock which displays a time, a clock in other electronic systems may be used to control an operation of the system. For example, a clock may be used to establish a warm-up period of time or may wait until mechanical components are stable. In the event of a power failure, the clock will be used to reset a warm-up period after power is resumed.

However, power shut-offs are often unintentional. For example, in the commercial domain, one-second power outages are common. These unintentional, short-term power outages often cause clocks to be reset. The power supply voltage may be unstable for a period of time. Mechanical devices such as motors or hard drives may still be moving while power is off to the electronics. When the power returns, the electronic system may not have any information regarding how long the power had been off. It must reestablish a clock which may be used in a start-up procedure. It must also consider attached devices for which different actions are necessary depending on how long they have been without power. For example, in certain electronic systems, the start-up period may be a warm-up period for a motor which requires time to reach operating speed or a lamp which needs to be heated to a certain temperature. However, without knowing how long the electronic system has been off, the electronic system will automatically restart the clock controlling the warm-up period, or may assume a motor is not turning when in fact it is still spinning, because power had been off only a very short time. Because the system may not have been off for long, restarting the warm-up period may lead to unnecessary delays in the operation of the electronic system. Resetting a motor speed to a small value if it is already moving rapidly may damage the motor or the attached components. It may also introduce electronic power surges. What is needed is an electronic device that can determine how long lower has been off, particularly for short power outages.

SUMMARY

A circuit structure for determining a period of time during which a device was without power is disclosed. The circuit structure includes a volatile memory storing known data and a test circuit coupled to the volatile memory. The test circuit determines an amount of incorrect data stored in the volatile memory after the period of time during which the device was without power. The amount of incorrect data is used to determine the period of time during which the device was without power.

The circuit structure may further include a non-volatile memory storing the known data, while the test circuit can include a comparator coupled to the volatile memory and the non-volatile memory and a counter indicating a number of incorrect bits stored in the volatile memory. A memory may be implemented to store characterization data associated with the volatile memory, the characterization data indicating estimated times for the period of time during which the device was without power based upon the amount of incorrect data.

The circuit structure may further include other elements such as a second volatile memory storing the known data, where the memory storing characterization data associated with the volatile memory further stores characterization data associated with the second volatile memory, and/or a control circuit coupled to an element of the device, where the control circuit controls the operation of the element of the device based on an estimated time during which the device was without power. Some embodiments include a temperature sensor coupled to the control circuit, where the temperature sensor provides a temperature associated with the volatile memory, and a memory storing characterization data associated with the volatile memory, the characterization data including estimated times for the period of time during which the device was without power for a plurality of temperatures.

A processor having a memory may also be provided, wherein the test circuit determines an amount of incorrect data stored in the volatile memory based upon data stored in the memory of the processor. In some embodiments, a processor is provided which implements the test circuit and counter. In some embodiments, the volatile memory is the cache of the processor or external DRAM.

According to an alternate embodiment, a circuit structure for determining a period of time during which a device was without power includes a volatile memory of a device having programmable logic, the volatile memory storing known data; a non-volatile memory storing the known data; and a test circuit coupled to the volatile memory and the non-volatile memory. The test circuit determines an amount of incorrect data stored in the volatile memory after the period of time during which the device was without power. The amount of incorrect data indicates the period of time during which the device was without power.

The non-volatile memory may be included in the device, or separate from the device. The known data may include, for example, a block of program code for determining a number of incorrect bits stored in the volatile memory after the period of time during which the device was without power. The test circuit may be implemented in the programmable logic of the device having programmable logic. The circuit structure may also include a processor, where the test circuit is implemented by the processor, or the test circuit may be separate from the device.

A method of controlling a device is also disclosed. The method includes storing known data in a volatile memory; comparing the data stored in the volatile memory after a period of time during which the device was without power with the known data; determining an amount of data stored in the volatile memory having incorrect values; estimating a period of time during which the device was without power based on the amount of data stored in the volatile memory having incorrect values; and controlling an element of the device (e.g., altering a start-up sequence of the element of the device) based upon the estimated period of time during which the device was without power.

Storing known data in a volatile memory may include storing configuration bits associated with programmable logic of the device. Estimating the period of time during which the device was without power may include determining an estimated time based upon a comparison of the amount of data stored in the volatile memory having incorrect values with characterization data associated with the volatile memory. The method may further include determining a temperature for the volatile memory, wherein estimating the period of time during which the device was without power comprises estimating the period of time based upon the determined temperature. The method may further include storing the known data in a non-volatile memory, where comparing the data stored in the volatile memory includes comparing the known data stored in the non-volatile memory with the data in the volatile memory after the period of time during which the device was without power.

BRIEF DESCRIPTION OF THE DRAWINGS

FIG. 11 is a flow chart showing a method of determining a period of time during which a device was without power, according to an embodiment of the present invention;

FIG. 12 is a flow chart showing a method of determining a period of time during which a device was without power based upon a temperature of the device, according to an embodiment of the present invention;

DETAILED DESCRIPTION

Figure 1:
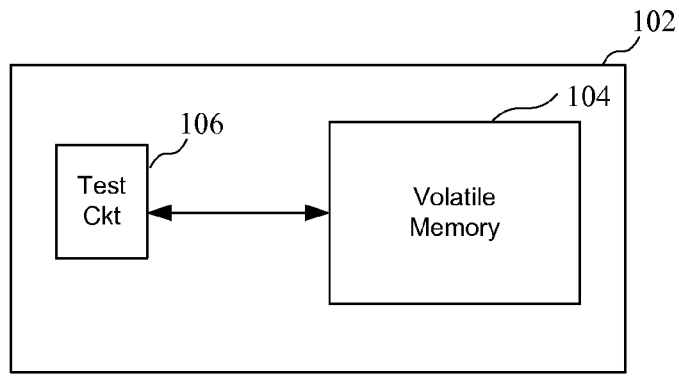
FIG. 1 is a block diagram of a circuit structure enabling determining a period of time during which a device was without power, according to an embodiment of the present invention.

Turning first to FIG. 1, a block diagram of a circuit structure (circuit) enabling determining a period of time during which a device was without power according to an embodiment of the present invention is shown. A circuit 102 comprises a volatile memory 104 coupled to a test circuit 106. The circuit 102 can be an integrated circuit, for example, or a circuit board having a plurality of elements implementing the test circuit and the volatile memory. As will be described in more detail below, the circuits and methods of the present invention detect when a system has been shut down for only a short period of time, enabling corrective action for the system which may include an action other than a complete start-up cycle. For example, the circuit of FIG. 1 may be used to transform a clock function by updating a clock setting, or preventing a system control clock from being reset. According to one embodiment, the timer may be used to indicate when a warm-up period is not required to be reset for a lamp in a scanner, for example, where the power had not been removed long enough to require a warm-up period. According to one embodiment, the timer may be used to indicate when a long delay may be required to allow motors or mechanical parts of a system to return to a known state.

The test circuit 106 of FIG. 1 determines how long a device has been without power based upon data remanence of the volatile memory 104. Data remanence is associated with the property that unpowered volatile memories lose their data over time, rather than all at once. The rate of data loss, though variable and dependent on a circuit design and temperature, can be determined and saved as characterization data. Because the amount of data decay in volatile memories that have been unpowered for a period of time may be determined, the amount of data lost may be used to establish a time measurement. More particularly, the data remanence of the system memory may be used to determine the amount of time that a system has been without power. Data in some memory devices may decay over a period of seconds. However, data remanence may vary between devices. For example, data in dedicated memory chips may decay faster than data in memory arrays implemented in a programmable logic device (PLD), such as a field programmable gate array (FPGA), for example.

When power to the circuit 102 is turned on, the circuit first re-powers the memory 104 to hold data and freeze the remanence pattern, or the pattern of the bits of the volatile memory as they exist after a power-up is detected. The next step in the boot-up operation for the circuit is to read the memory, and determine the amount of incorrect data in the volatile memory. The determination of the amount of correct data may be used to approximate the elapsed time that the power has been off. For example, remanence characterization data may be stored in a characterization table associated with the system, where the characterization data indicates how long the power has been off based upon the amount of incorrect data in the non-volatile memory. For example, if an initial memory block of the non-volatile memory stores all logical "zeros" at 25 Celsius (C), and there are 10% logical "ones" after power-up, it may be concluded that power has been off for about 10 seconds based upon data stored in the characterization table. That is, the data stored in the characterization table comprises characterization data indicating remanence patterns for known amounts of time after which power has been removed from the memory. While data generally decays according to a decay curve, the data stored in the characterization table may represent certain points on the curve. The actual value selected for a period of time may be chosen based on the nearest value to the detected value, or may be interpolated based upon the detected value.

As will be described in more detail below, the empirical data may be stored for different memory devices, and for each of those memory devices at different operating temperatures. Appropriate action may then be taken for a particular system implementing the circuit based on a power-off time determined from a memory storing characterization data associated with one or more non-volatile memories. As will be described in more detail below in reference to FIG. 10, different actions may be taken based upon the type of device implementing the circuit 102. While reference is made to a number of bits of incorrect data being used to determine a time period, it should be understood that other criteria, such as bytes of data or a result of a specific error correction technique, can be used to determine a period of time during which a device is without power.

Figure 2:
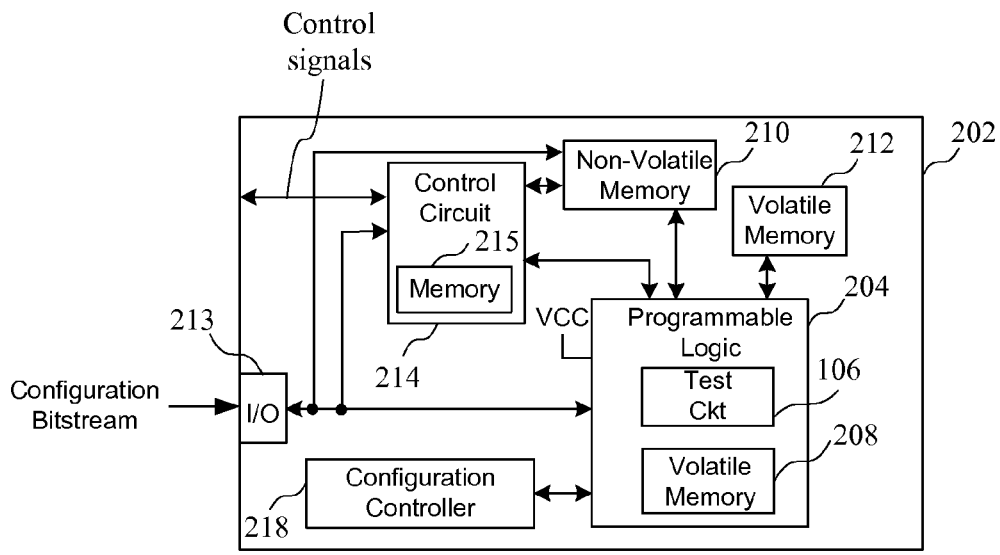
FIG. 2 is a block diagram of a device having programmable logic incorporating a test circuit enabling determining a period of time during which a device was without power, according to an embodiment of the present invention.

Turning now to FIG. 2, a block diagram of a device having programmable logic incorporating a test circuit enabling determining a period of time during which a device was without power, according to an embodiment of the present invention is shown. A device 202 incorporates programmable logic 204, where the test circuit 106 is implemented in the programmable logic. According to the embodiment of FIG. 2, the programmable logic may comprise volatile memory 208, and may be coupled to other circuits such as a non-volatile memory 210 and/or a volatile memory 212. The non-volatile memory 210 may be coupled to an I/O port 213 of the device, enabling a control circuit 214 having a memory 215 to load a configuration bitstream from the I/O port 213 into the non-volatile memory 210 of the device. As will be described in more detail below, the control circuit 214 may be a processor, where the memory 215 of the processor may be a volatile memory cache for storing program code or data.

The configuration bitstream may be loaded into the non-volatile memory 210 of the device 202, and then loaded into the volatile memory 208 and the volatile memory 212. Alternatively, the configuration bitstream may be loaded directly into the volatile memory 208 and the volatile memory 212 by the control circuit 214 or the configuration controller 218. As will be described in more detail below in reference to FIGS. 8 and 9, the volatile memory 208 may be associated with configurable logic blocks, while the volatile memory 212 may be associated with blocks of random access memory (BRAMs) or with configuration memory cells, for example. After a power outage, the program code or data stored in the memory 215, the volatile memory 208, and/or the volatile memory 212 may be compared to the same program code or data stored in the non-volatile memory 210, or in some other non-volatile memory, to determine how long the device has been without power.

Figure 3:
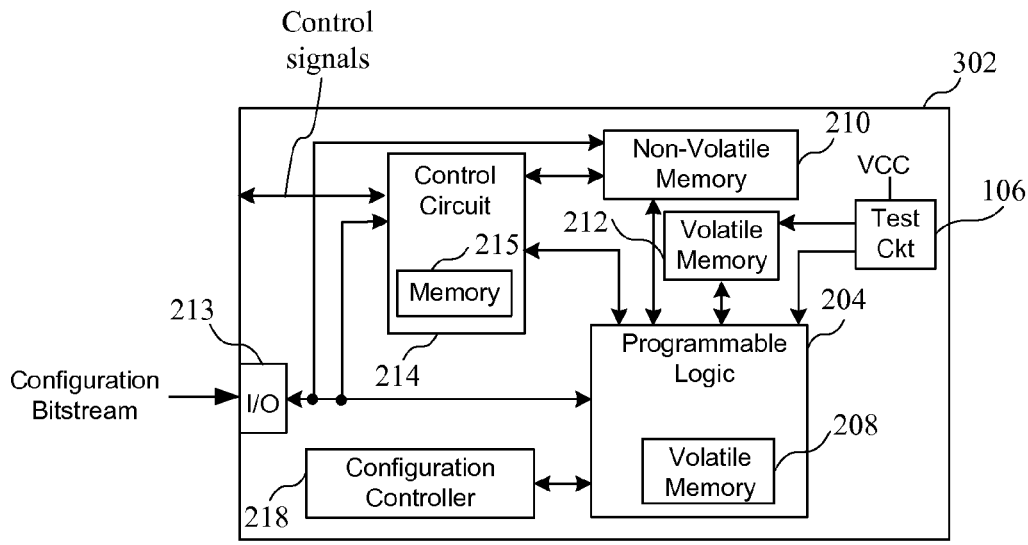
FIG. 3 is a block diagram of a device having programmable logic and a test circuit enabling determining a period of time during which a device was without power, according to an alternate embodiment of the present invention.
Figure 4:
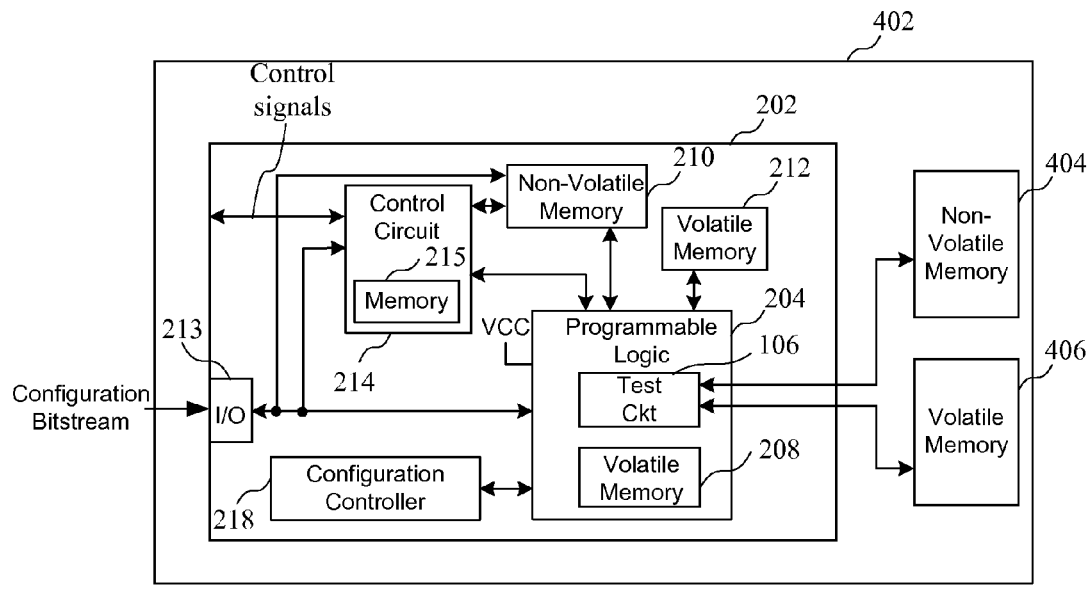
FIG. 4 is a block diagram of an electronic system comprising a device having programmable logic incorporating a test circuit enabling determining a period of time during which a device was without power, according to an embodiment of the present invention.
Figure 5:
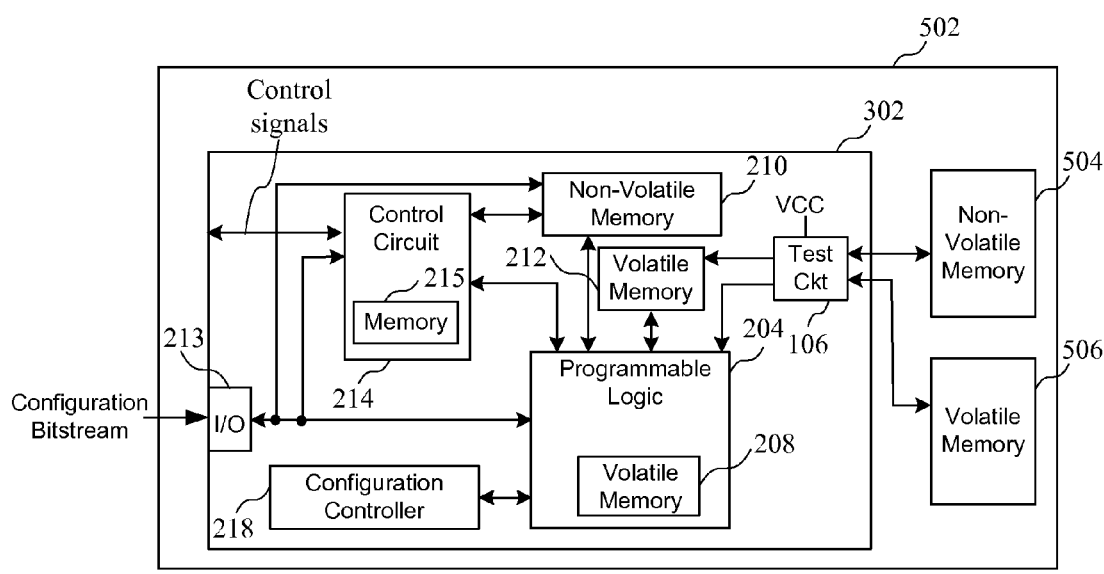
FIG. 5 is a block diagram of an electronic system comprising a device having programmable logic and a test circuit enabling determining a period of time during which a device was without power, according to an alternate embodiment of the present invention.

As shown in the embodiment of FIG. 3, the device 302 having programmable logic comprises a test circuit 106 which is implemented separate from the programmable logic 204. For example, the test circuit 106 may be implemented in hard logic of the device. The circuits and methods of the present invention may also be implemented using memory devices external to the device having programmable logic. For example, in the embodiment of FIG. 4, a system 402 implements the device 202, which is coupled to non-volatile memory 404 and volatile memory 406 external to the device. According to the embodiment of FIG. 5, a system 502 implements the device 302 which is coupled to non-volatile memory 504 and volatile memory 506 external to the device 302. As will be described in more detail below, data stored in a volatile memory after power is removed and restored may be compared to the same data stored in a non-volatile memory to determine the amount of time during which a device was without power. In some embodiments, a test circuit or program may use redundancy in the data, for example parity or other error correcting codes, to determine how much of the volatile memory is corrupted. In these embodiments, non-volatile memory is not required for comparison.

Because memories tend to decay exponentially, an estimated time may be inaccurate due to the change of only a few bits. Accordingly, a more accurate estimate may be obtained using characterization data associated with multiple memory devices, and more particularly, using characterization data associated with different memory devices from different device suppliers. While blocks of logical "ones" or logical "zeros" stored in memory devices may be used, the program code in the memory of a processor is a source of readily available data. The program code may be particularly useful if there is not enough volatile memory available to store additional data to be used by the test circuit. Thus, the known program code stored in a non-volatile memory may be compared with the values of the program code stored in a volatile memory cache in the processor or DRAM external to the processor, for example. It is possible to designate a specific region in the memory of the processor as the time-out remanence timer. Because blocks of all logical "ones" and all logical "zeros" in the memories decay at different rates, the time periods may be established based upon specific data patterns used by the test circuits, where the data patterns may comprise all logical "ones," all logical "zeros," or a pattern having a combination of logical "ones" and logical "zeros." A characterization table storing the empirical data may store data for a number of different memory devices and/or different data patterns.

Further, it may be beneficial for the system to calibrate the decay time of its memories at an initial boot-up. Such a calibration would give the correct empirical data associated with the specific memory actually in a device, reducing the amount of memory needed to store data. Alternatively, the remanence calibration may be performed every time the system starts up to create data for the current memories at the current temperature, as will be described in more detail in reference to the method of FIG. 15. Because the temperature of the device may vary over time, either due to variations in ambient temperature or due to increased temperature of the device as a result of the operation of the device, empirical data may be determined and stored at various times during the operation of the device. For example, the empirical data may be determined on a periodic basis, where data is collected until there are enough data points or until the data covers a wide enough range of temperatures. Accordingly, the correct empirical data can be used to determine the time period that the device has been without power. The temperature of the device may rise when it is operating, and cool when power is off, for example. However, a device will not cool very much on the timescale for the circuits and methods of the present invention, and it is possible that a reasonably accurate result may be obtained assuming a fixed temperature. Further, the memory used for determining the time period that the device is without power may be placed away from heat sources of the device to avoid temperature fluctuations in the system.

Figure 6:
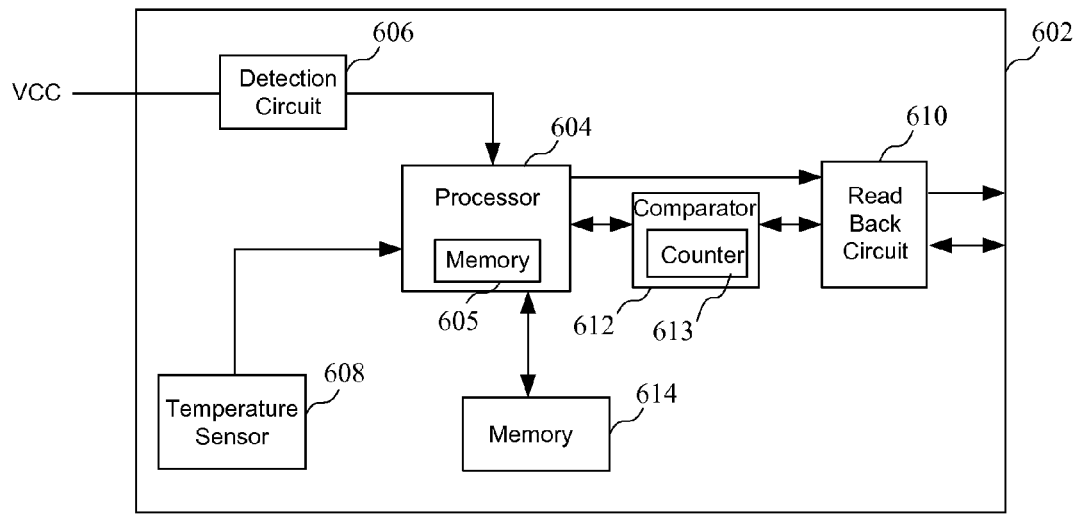
FIG. 6 is a block diagram of a circuit enabling determining a period of time during which a device was without power based upon a detected temperature, according to an embodiment of the present invention.

FIG. 6 shows a block diagram of a circuit enabling determining a period of time during which a device was without power based upon a detected temperature, according to another embodiment of the present invention. As set forth above, temperature plays an important part in the data associated with non-volatile memories. The failure to take temperature into account or an inaccurate estimate of the temperature may have a dramatic effect on the time estimate. Therefore, according to some embodiments of the present invention, the circuits and methods of the present invention may incorporate a temperature sensor, where a temperature may be determined at power-up to determine which temperature-related data to use.

According to the embodiment of FIG. 6, a circuit 602 includes a processor 604 having a volatile memory 605. The volatile memory 605 can comprise a memory cache, for example, for storing data to be used by a test circuit. A detection circuit 606 coupled to the processor indicates when a power signal, designated in FIG. 6 as VCC, is applied to the device. A temperature sensor 608 is also coupled to the processor. The temperature sensor is preferably placed in a location to most accurately indicate the temperature of the volatile memory. A readback circuit 610 enables reading data from a non-volatile memory to enable a comparison of the data in the volatile memory with known data in a comparator 612. The comparator 612 may include an "exclusive or" (XOR) circuit, for example, which generates an error signal when the data values do not match. A counter 613 may keep a count of the errors to determine a data decay value for the data stored in the volatile memory (e.g., memory 605), and therefore a corresponding time during which the circuit was without power.

In some embodiments, readback circuit 610 and comparator 612 may be functions performed by processor 604, rather than discrete elements of the circuit as shown in FIG. 6. The volatile memory may be internal to processor 604, e.g. memory 605, which may be the processor cache. In some embodiments, the volatile memory may be external to processor 604, such as memory 614 or DRAM memory external to the circuit (not shown). The non-volatile memory may be a hard disk drive external to circuit 602.

Figure 7:
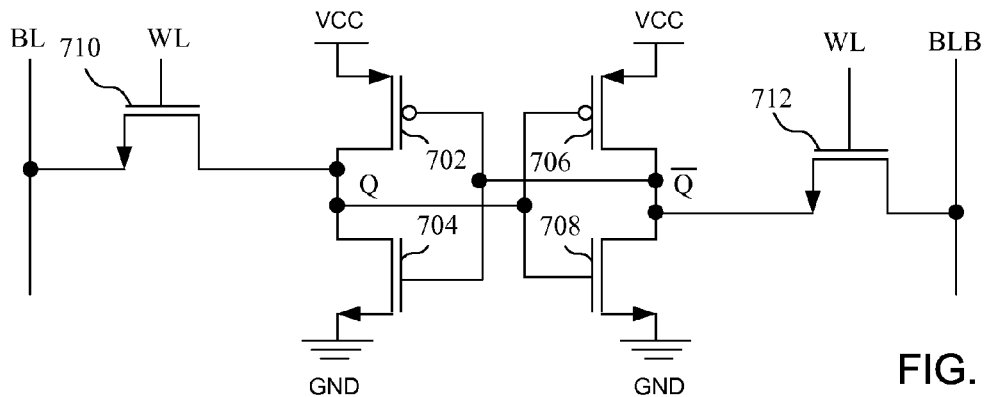
FIG. 7 is a circuit diagram of a memory element of a volatile memory that may be implemented in FIGS. 1-6, according to an embodiment of the present invention.

FIG. 7 shows a circuit diagram of a memory element of a volatile memory that may be implemented in an electronic system, according to another embodiment of the present invention. In particular, a memory cell of a volatile memory according to one embodiment includes an inverter having a p-channel transistor 702 with a source coupled to a reference voltage, such as VCC, and a drain coupled at a first node "Q" to a drain of an n-channel transistor 704, the source of which is coupled to ground GND. The memory cell also includes a second inverter having a p-channel transistor 706 with a source coupled to the reference voltage and a drain coupled at a second node "Q-bar" to a drain of an n-channel transistor 708, the source of which is also coupled to ground. The first node "Q" is controlled by an n-channel transistor 710 coupled to receive a word line (WL) signal at its gate and to receive input data on a bit line (BL) at the first node, while the second node "Q-bar" is controlled by another n-channel transistor 712 coupled to receive the word line signal WL at its gate to receive inverted input data BLB. While the volatile memory of FIG. 7 is shown by way of example, it will be clear to those of skill in the art that other volatile memory cells can be employed, including a dynamic random-access memory DRAM, for example.

Figure 8:
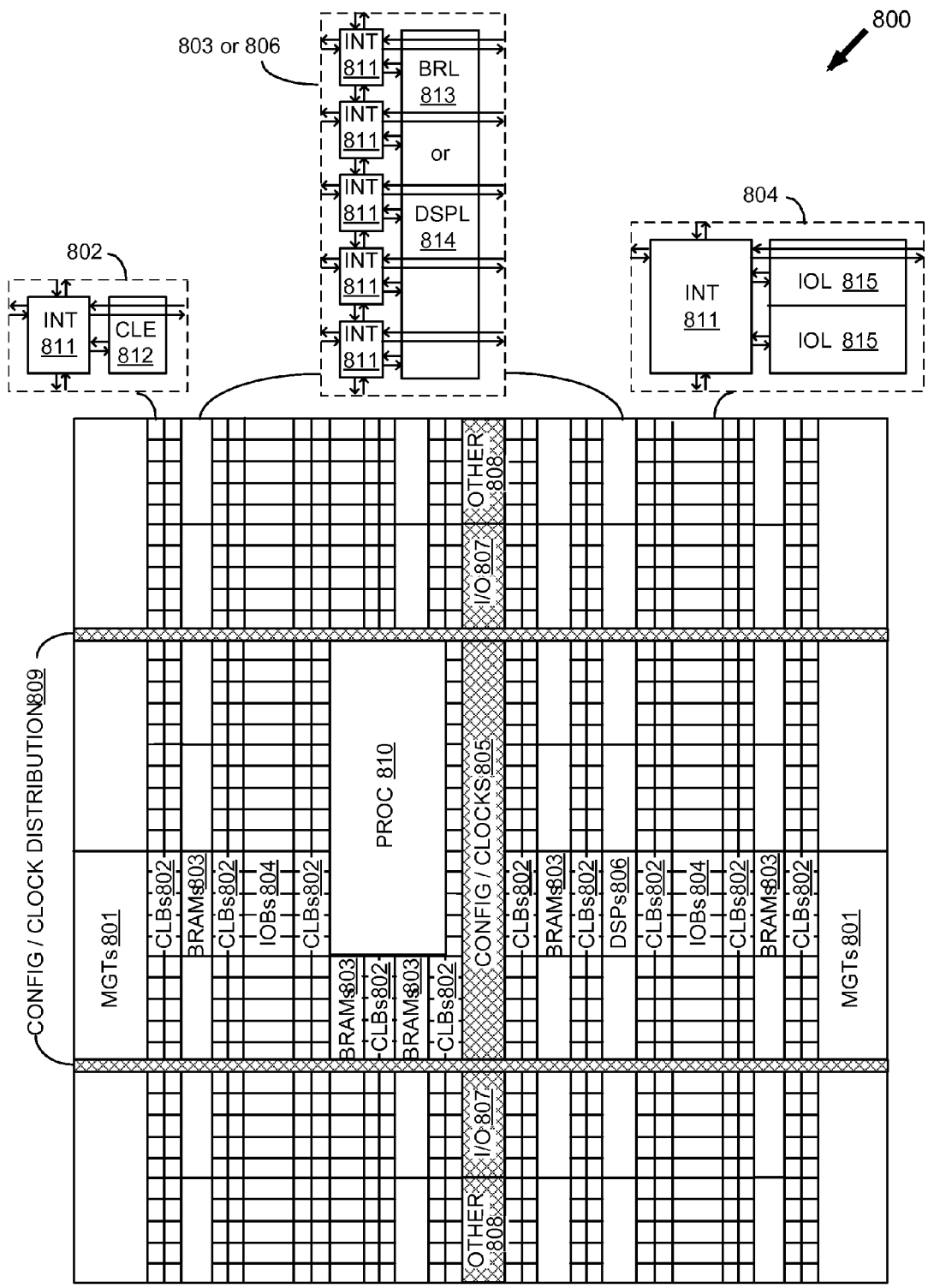
FIG. 8 is a block diagram of a device having programmable logic, according to an embodiment of the present invention.

Turning now to FIG. 8, a block diagram of a device having programmable logic according to an embodiment of the present invention is shown. While devices having programmable logic may be implemented in any type of integrated circuit device, such as an application specific integrated circuit (ASIC) having programmable logic, other devices comprise dedicated programmable logic devices (PLDs). A PLD is an integrated circuit device designed to be user-programmable so that users may implement logic designs of their choices. One type of PLD is the Complex Programmable Logic Device (CPLD). A CPLD includes two or more "function blocks" connected together and to input/output (I/O) resources by an interconnect switch matrix. Each function block of the CPLD includes a two-level AND/OR structure similar to that used in a Programmable Logic Array (PLA) or a Programmable Array Logic (PAL) device. Another type of PLD is a field programmable gate array (FPGA). In a typical FPGA, an array of configurable logic blocks (CLBs) is coupled to programmable input/output blocks (IOBs). The CLBs and IOBs are interconnected by a hierarchy of programmable routing resources. These CLBs, IOBs, and programmable routing resources are customized by loading a configuration bitstream, typically from off-chip memory, into configuration memory cells of the FPGA. For both of these types of programmable logic devices, the functionality of the device is controlled by configuration data bits of a configuration bitstream provided to the device for that purpose. The configuration data bits may be stored in volatile memory (e.g., static memory cells, as in FPGAs and some CPLDs), in non-volatile memory (e.g., flash memory, as in some CPLDs), or in any other type of memory cell.

FIG. 8 illustrates an FPGA architecture 800 having a large number of different programmable tiles including multi-gigabit transceivers (MGTs 801), configurable logic blocks (CLBs 802), random access memory blocks (BRAMs 803), input/output blocks (IOBs 804), configuration and clocking logic (CONFIG/CLOCKS 805), digital signal processing blocks (DSPs 806), specialized input/output blocks (I/O 807) (e.g., configuration ports and clock ports), and other programmable logic 808 such as digital clock managers, analog-to-digital converters, system monitoring logic, and so forth. Some FPGAs also include dedicated processor blocks (PROC 810).

In some FPGAs, each programmable tile includes a programmable interconnect element (INT 811) having standardized connections to and from a corresponding interconnect element in each adjacent tile. Therefore, the programmable interconnect elements taken together implement the programmable interconnect structure for the illustrated FPGA. The programmable interconnect element (INT 811) also includes the connections to and from the programmable logic element within the same tile, as shown by the examples included at the top of FIG. 8.

For example, a CLB 802 may include a configurable logic element (CLE 812) that may be programmed to implement user logic plus a single programmable interconnect element (INT 811). A BRAM 803 may include a BRAM logic element (BRL 813) in addition to one or more programmable interconnect elements. The BRAM comprises dedicated memory separate from the distributed RAM of a configurable logic block. Typically, the number of interconnect elements included in a tile depends on the height of the tile. In the pictured embodiment, a BRAM tile has the same height as four CLBs, but other numbers (e.g., five) may also be used. A DSP tile 806 may include a DSP logic element (DSPL 814) in addition to an appropriate number of programmable interconnect elements. An IOB 804 may include, for example, two instances of an input/output logic element (IOL 815) in addition to one instance of the programmable interconnect element (INT 811). The location of connections of the device is controlled by configuration data bits of a configuration bitstream provided to the device for that purpose. The programmable interconnects, in response to bits of a configuration bitstream, enable connections comprising interconnect lines to be used to couple the various signals to the circuits implemented in programmable logic, or other circuits such as BRAMs or the processor.

In the pictured embodiment, a columnar area near the center of the die (shown shaded in FIG. 8) is used for configuration, clock, and other control logic. Horizontal areas 809 extending from this column are used to distribute the clocks and configuration signals across the breadth of the FPGA. Some FPGAs utilizing the architecture illustrated in FIG. 8 include additional logic blocks that disrupt the regular columnar structure making up a large part of the FPGA. The additional logic blocks may be programmable blocks and/or dedicated logic. For example, the processor block PROC 810 shown in FIG. 8 spans several columns of CLBs and BRAMs.

Note that FIG. 8 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 8 are purely exemplary. For example, in an actual FPGA more than one adjacent column of CLBs is typically included wherever the CLBs appear, to facilitate the efficient implementation of user logic.

Figure 9:
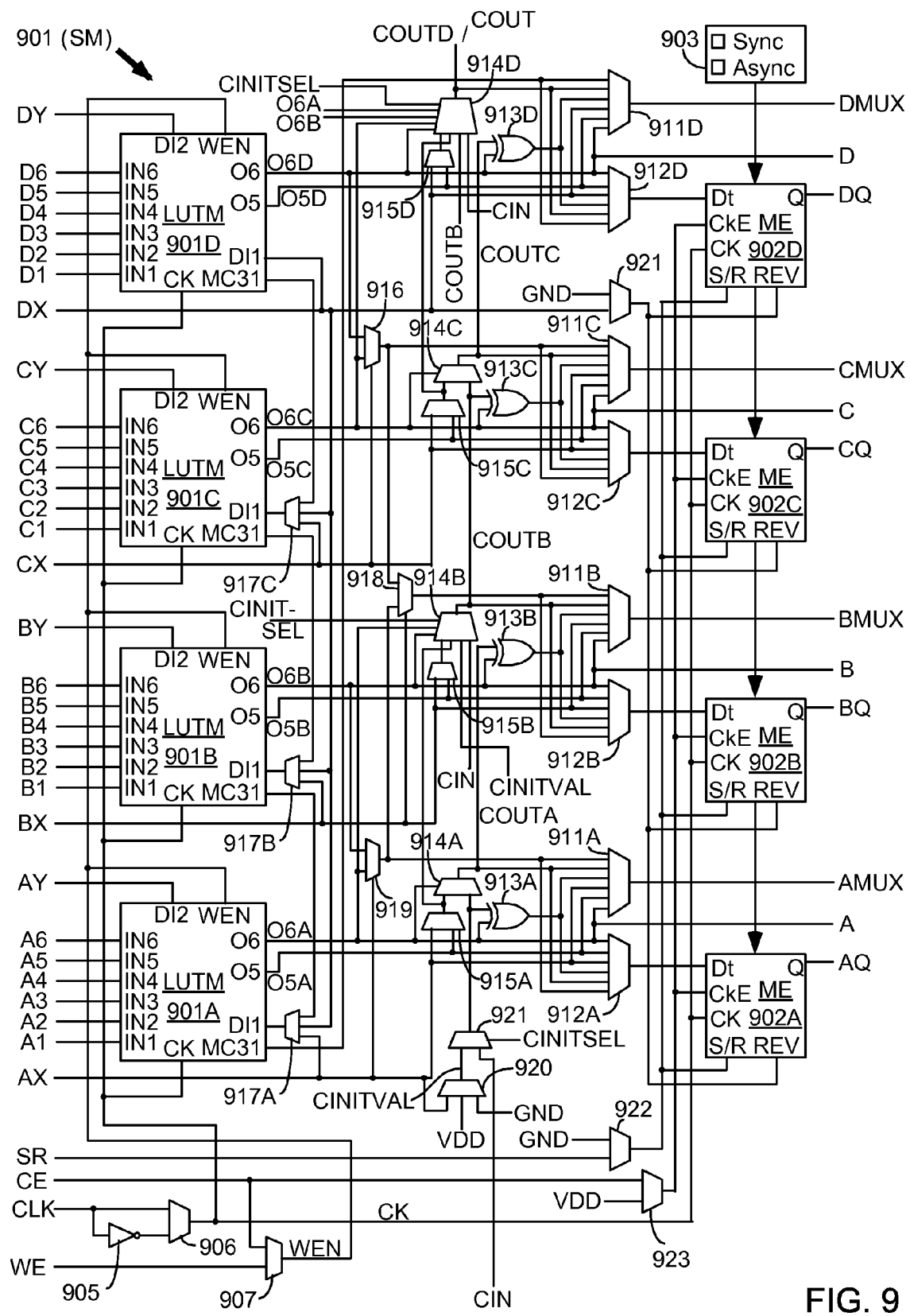
FIG. 9 is a block diagram of a configurable logic element of the device of FIG. 8, according to an embodiment of the present invention.

Turning now to FIG. 9, a block diagram of a configurable logic element of the device of FIG. 8 according to an embodiment of the present invention is shown. In particular, FIG. 9 illustrates in simplified form a configurable logic element 812 of a configuration logic block 802 of FIG. 8. In the embodiment of FIG. 9, slice M 901 includes four lookup tables (LUTMs) 901A-901D, each driven by six LUT data input terminals A1-A6, B1-B6, C1-C6, and D1-D6 and each providing two LUT output signals O5 and O6. The O6 output terminals from LUTs 901A-901D drive slice output terminals A-D, respectively. The LUT data input signals are supplied by the FPGA interconnect structure via input multiplexers, which may be implemented by programmable interconnect element 911, and the LUT output signals are also supplied to the interconnect structure. Slice M also includes: output select multiplexers 911A-911D driving output terminals AMUX-DMUX; multiplexers 912A-912D driving the data input terminals of memory elements 902A-902D; combinational multiplexers 916, 918, and 919; bounce multiplexer circuits 922-923; a circuit represented by inverter 905 and multiplexer 906 (which together provide an optional inversion on the input clock path); and carry logic comprising multiplexers 914A-914D, 915A-915D, 920-921 and exclusive OR gates 913A-913D. All of these elements are coupled together as shown in FIG. 9. Where select inputs are not shown for the multiplexers illustrated in FIG. 9, the select inputs are controlled by configuration memory cells. That is, configuration bits of the configuration bitstream stored in configuration memory cells are coupled to the select inputs of the multiplexers to select the correct inputs to the multiplexers. These configuration memory cells, which are well known, are omitted from FIG. 9 for clarity, as well as from other selected figures herein.

In the pictured embodiment, each memory element 902A-902D may be programmed to function as a synchronous or asynchronous flip-flop or latch. The selection between synchronous and asynchronous functionality is made for all four memory elements in a slice by programming Sync/Asynch selection circuit 903. When a memory element is programmed so that the S/R (set/reset) input signal provides a set function, the REV input terminal provides the reset function. When the memory element is programmed so that the S/R input signal provides a reset function, the REV input terminal provides the set function. Memory elements 902A-902D are clocked by a clock signal CK, which may be provided by a global clock network or by the interconnect structure, for example. Such programmable memory elements are well known in the art of FPGA design. Each memory element 902A-902D provides a registered output signal AQ-DQ to the interconnect structure. Because each LUT 901A-901D provides two output signals, O5 and O6, the LUT may be configured to function as two 5-input LUTs with five shared input signals (IN1-1N5), or as one 6-input LUT having input signals IN1-IN6.

In the embodiment of FIG. 9, each LUTM 901A-901D may function in any of several modes. When in lookup table mode, each LUT has six data input signals IN1-1N6 that are supplied by the FPGA interconnect structure via input multiplexers. One of 64 data values is programmably selected from configuration memory cells based on the values of signals IN1-IN6. When in RAM mode, each LUT functions as a single 64-bit RAM or two 32-bit RAMs with shared addressing. The RAM write data is supplied to the 64-bit RAM via input terminal DI1 (via multiplexers 917A-917C for LUTs 901A-901C), or to the two 32-bit RAMs via input terminals DI1 and DI2. RAM write operations in the LUT RAMs are controlled by clock signal CK from multiplexer 906 and by write enable signal WEN from multiplexer 907, which may selectively pass either the clock enable signal CE or the write enable signal WE. In shift register mode, each LUT functions as two 16-bit shift registers, or with the two 16-bit shift registers coupled in series to create a single 32-bit shift register. The shift-in signals are provided via one or both of input terminals DI1 and DI2. The 16-bit and 32-bit shift out signals may be provided through the LUT output terminals, and the 32-bit shift out signal may also be provided more directly via LUT output terminal MC31. The 32-bit shift out signal MC31 of LUT 901A may also be provided to the general interconnect structure for shift register chaining, via output select multiplexer 911D and CLE output terminal DMUX.

The circuits of FIGS. 1-7 may be implemented in the device of FIGS. 8 and 9, or in any suitable device, including any type of integrated circuit having programmable logic. The determination of the time period that a device may be without power may be performed using memory elements internal or external to the device of FIG. 8, as set forth above in the embodiments of FIGS. 1-7, including, but not limited to, memory elements 902A-D, LUTM 901A-D, BRAM 803, and configuration memory cells that may control select inputs of the multiplexers in FIG. 9.

Figure 10:
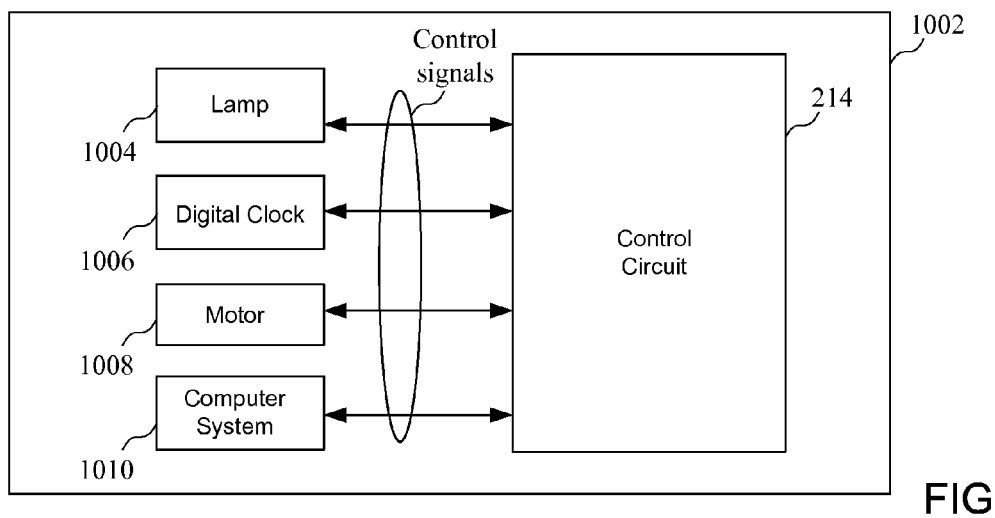
FIG. 10 is a block diagram of an electronic system enabling determining a period of time during which a device was without power, according to an embodiment of the present invention.

FIG. 10 shows a block diagram of an electronic system 1002 enabling determining a period of time during which a device was without power, according to yet another embodiment of the present invention. The control circuit 214 (see FIGS. 2-5) may also be used to control various elements of the electronic system 1002. A lamp 1004, a digital clock 1006, a motor 1008, and a computer system 1010 are shown in FIG. 10 as examples of elements of the system that may be controlled by the control signals, based upon a period of time during which the power has been off.

By way of example, in a system controlling a motor, as is common in industrial control applications, if the power is off less than a predetermined period of time (e.g., less than 10 seconds) the power off will be kept off for a total period of time, or ten seconds in this case, to ensure that there are no current spikes or rapid changes of power on the motors that could damage electrical or mechanical components of the controlled system. If it is determined that the device has been off for more than ten seconds, startup will be resumed without delay with the normal startup sequence.

In an exemplary computer system, if the power is off for less than 100 ms, a memory error checking and correcting (ECC) function is run and operation resumes without reboot. If the power is off more than 10 seconds, reboot proceeds as normal. However, it should be noted that in some cases, the memory could retain the correct data if the power fell far enough to trigger a brownout, but stayed high enough that the memory was not affected. Therefore, if power is off between 100 ms and ten seconds, the computer is rebooted after the 10 seconds have passed. A computer that has been powered-down for only a few seconds may not need to get a new IP address or may not need to re-connect to a wireless network, and these operations may be omitted even if the computer is required to reboot. Omitting these operations not only saves time, but also may be more secure because the security of some wireless protocols is vulnerable to repeated initialization.

The operation of a lamp in a device such as a scanner or copier that would normally require a warm-up period may need to be addressed based upon the amount of time that power has been removed. The lamps may need to be kept off, or fans may be restarted before the lamp is turned on, if power has been determined to be off for a certain period.

The above examples describe using the circuits and methods of the invention to alter a startup sequence of one or more elements of a device. However, the circuits and methods of the invention also have other applications. For example, if power has been off for a short-enough period, such as less than one second, a system may log the event with an estimated time derived using the methods of the present invention. Such a log may be helpful in debugging and failure analysis. For example, if the power applied to a device is out for a short period, the system may treat the event as a potential tamper event, e.g., an adversary may be tampering with the power supply to try to get some critical bits to flip. The event can be logged as a power flicker, where too many power flickers may indicate that an attack is in progress.

A digital clock that does not automatically reset to 12:00 on power flicker, but rather maintains the same time as when the device lost power, is another example of a circuit that may benefit from the circuits and methods of the present invention. If it is known approximately how long the device has been without power, the clock can continue timekeeping, and may adjust its time based on a determined time-off value. If the power has been off for more than 20 seconds, for example, an estimation of the time period during which the clock was off may be too inaccurate to allow adjusting the clock to the current time. While a 'completely reset' condition could entail using a wireless internet or cellular telephone connection to get the correct time, these types of operations consume significant power and should be avoided if it is necessary to save battery energy. Therefore, the circuits and method of the invention may be applied to the digital clock to appropriately adjust the displayed time while preventing a complete reset when the power is off for from zero to 20 seconds.

The following flow charts show methods that may be implemented according to some aspects of the present invention. Turning first to FIG. 11, a flow chart shows a method of determining a period of time during which a device was without power, and using the determined time period to control the device. In particular, power-up is detected in a device at a step 1102. Data stored in a volatile memory associated with the device is read at a step 1104, where the volatile memory can be on the device or external to the device. The data read from the volatile memory is compared to known valid data at a step 1106. For example, the known valid data can be stored in a non-volatile memory. In some embodiments, step 1106 performs a comparison by checking the result of a parity check or other error-correcting code (ECC) or comparison with other redundancy in the data stored in the volatile memory. The amount of corrupted data is determined based upon the comparison at a step 1108. The amount of time that the device was without power is estimated based upon the amount of corrupted data in the volatile memory at a step 1110. Appropriate action is taken based upon the particular elements used in the device (i.e., the type of the device) and the amount of time that the power has been off at a step 1112. The appropriate action includes controlling the device in an advantageous fashion, such as in the examples relating to motors, computer systems, lamps, and digital clocks described above in relation to FIG. 10.

Turning now to FIG. 12, a flow chart shows a method of determining a period of time during which a device was without power based upon a temperature of the device, and using the determined time period to control the device, according to another embodiment of the present invention. Power-up is detected in a device at a step 1202. The temperature of a circuit in the device is determined at a step 1204, and data stored in a volatile memory is read at a step 1206. The data read from the volatile memory is compared to known valid data at a step 1208. The amount of corrupted data due to loss of power to the volatile memory is determined based upon the comparison at a step 1210. The amount of time that the power was off is estimated based upon the amount of corrupted data and the detected temperature at a step 1212. For example, the amount of time may be determined from a characterization table associated with the type of volatile memory and the detected temperature. Appropriate action is taken based upon the particular elements used in the device and the amount of time that the power has been off at a step 1214. As with the other flow charts illustrated herein, examples of actions for particular elements of devices are described in reference to FIG. 10.

Figure 13:
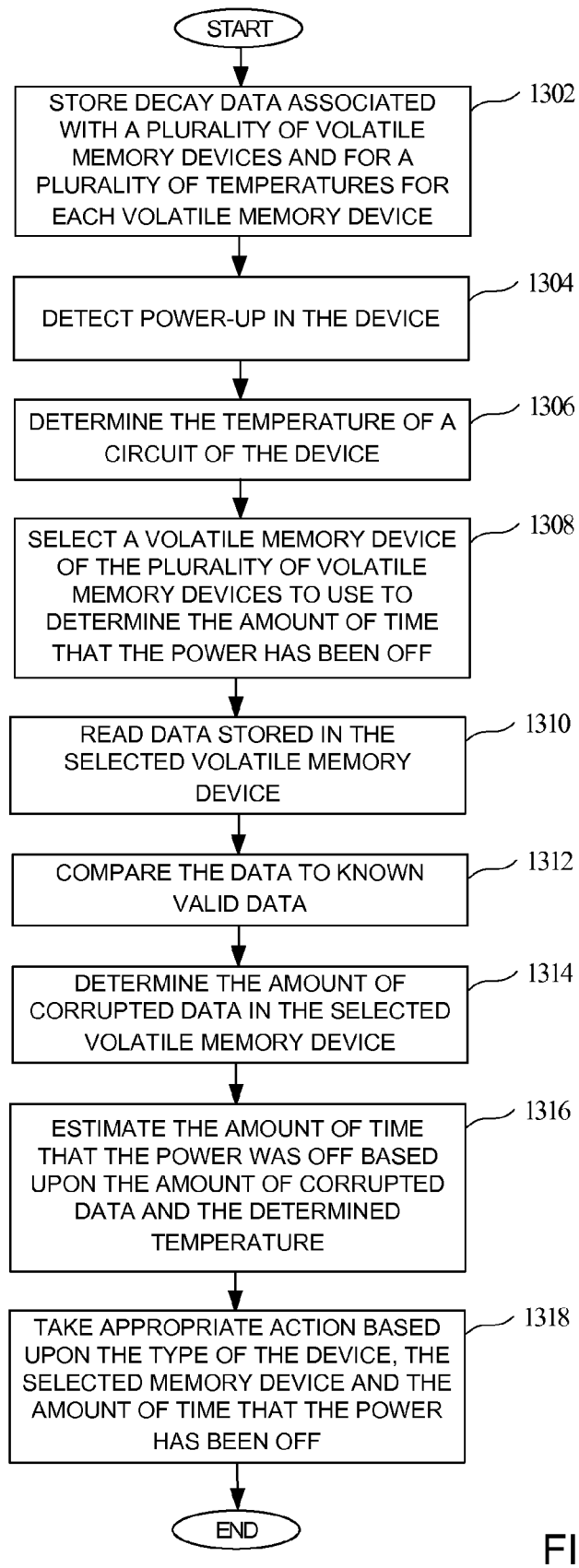
FIG. 13 is a flow chart showing a method of determining a period of time during which a device was without power using a plurality of volatile memory devices, according to an embodiment of the present invention.

Turning now to FIG. 13, a flow chart shows a method of determining a period of time during which a device was without power using a plurality of volatile memory devices, and using the determined time period to control the device, according to an embodiment of the present invention. Decay data associated with a plurality of volatile memory devices and a plurality of temperatures is stored for each volatile memory device at a step 1302. Power-up is detected at a step 1304, and the temperature of the non-volatile memory is determined at a step 1306. A volatile memory device of the plurality of volatile memory devices is selected to be used to determine the amount of time that power has been off at a step 1308. Data stored in the selected volatile memory device is read at a step 1310. The data is compared to known valid data at a step 1312. The amount of corrupted data in the selected volatile memory device is determined at a step 1314. The amount of time that the device was without power is estimated based upon the amount of corrupted data and the determined temperature at a step 1316. Appropriate action is taken based upon the application of the memory device and the amount of time that the power has been off at a step 1318.

Figure 14:
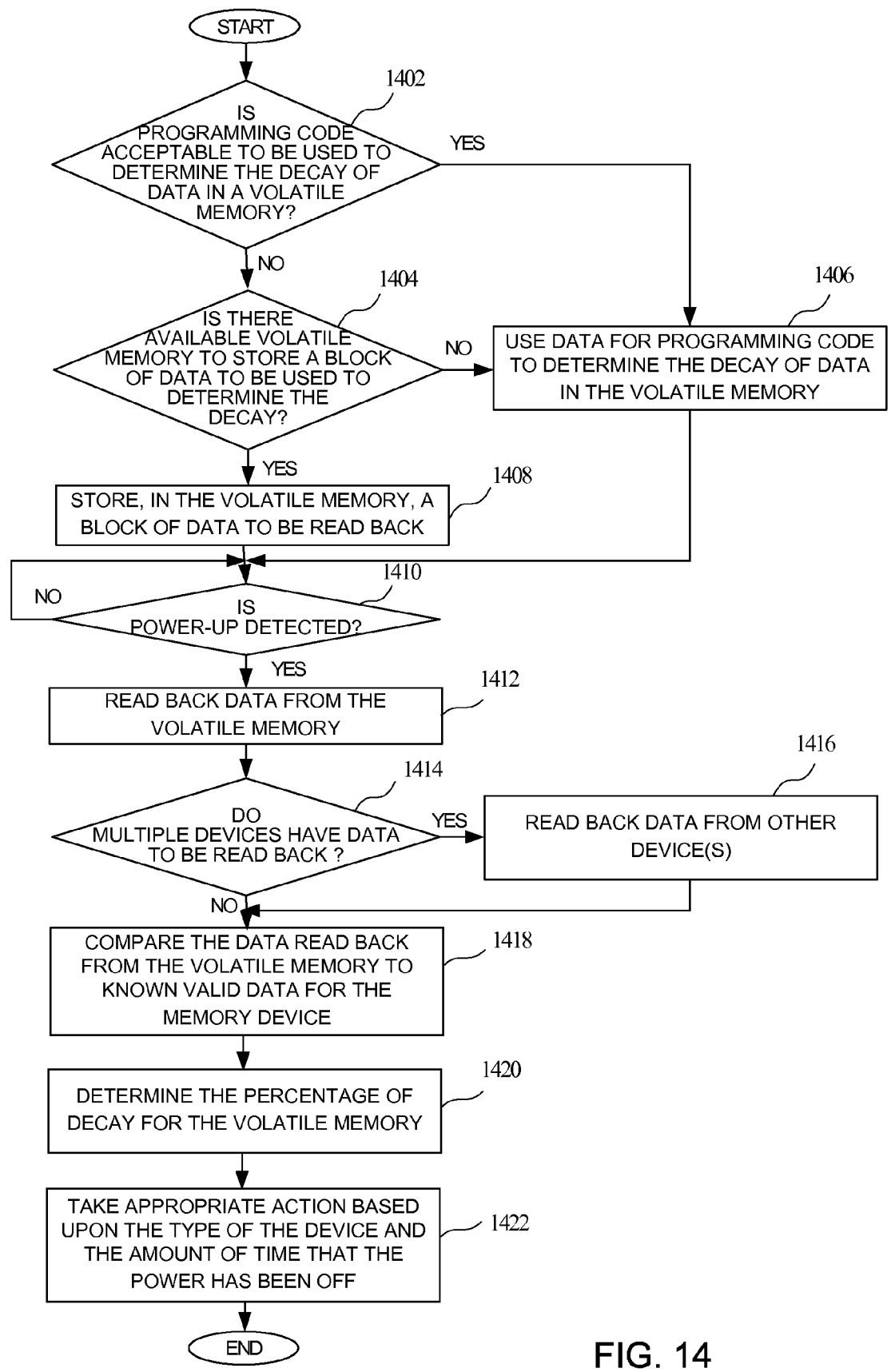
FIG. 14 is a flow chart showing a method of determining a period of time during which a device was without power using multiple volatile memories, according to an embodiment of the present invention.

Turning now to FIG. 14, a flow chart shows a method of determining a period of time during which a device was without power using multiple volatile memories, and using the determined time period to control the device, according to an embodiment of the present invention. It is determined if programming code is acceptable to be used to determine decay of data in a memory device at a step 1402. If the programming code is acceptable, or if there is no available volatile memory to store a block of data to be used to determine the decay of data in a memory device at a step 1404, data for the programming code is used to determine the decay of data in the volatile memory at a step 1406. If there is no acceptable programming code, but there is available volatile memory to store a block of data to be used to determine decay, a block of data to be read back is stored in one or more volatile memories at a step 1408.

It is then determined whether power-up is detected at a step 1410. If power-up is detected, data is read back from a volatile memory (either the programming code or the data stored in the volatile memory at step 1408) at a step 1412. It is then determined whether multiple volatile memories having data to be read back are detected at a step 1414. If so, data is read back from the other volatile memory(ies) at a step 1416. Data read back is then compared to known valid data at a step 1418. Finally, the amount of time that the device was without power is determined at a step 1420. Appropriate action is taken based upon the particular elements used in the device and the amount of time that the power has been off at a step 1422.

Figure 15:
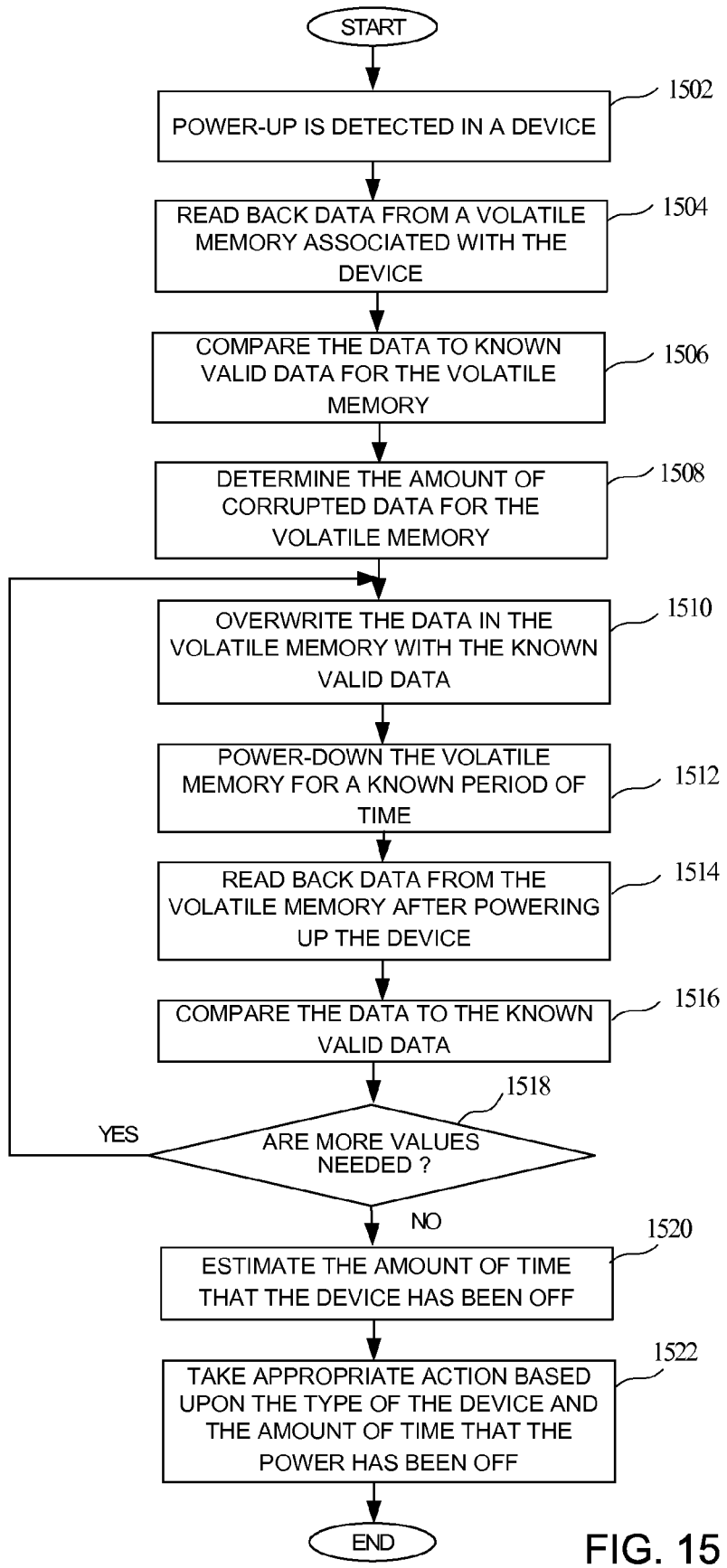
FIG. 15 is a flow chart showing a method of determining a period of time during which a device was without power using system data stored at power-up, according to an embodiment of the present invention.

Finally, turning to FIG. 15, a method of determining a period of time during which a device was without power using system data stored at power-up, and using the determined time period to control the device, according to an embodiment of the present invention is shown. Because it is possible to determine the empirical characterization data associated with the decay rate of data in a volatile memory quickly enough to use that data to determine a time period during which a device was without power, characterization data may be determined after an initial power-up. Determining the data after a power-up eliminates any need to permanently store the characterization data. After a power-up is detected, once a determination of the amount of elapsed power-off time is made, the data associated with the decay rate for a volatile memory may be saved or deleted.

In particular, power-up is detected in a device at a step 1502. Data stored in a volatile memory associated with the device is read at a step 1504, where the volatile memory can be on the device or external to the device. The data read from the volatile memory is compared to known valid data at a step 1506. For example, the known valid data can be stored in a non-volatile memory. The amount of corrupted data is determined, based upon the comparison in step 1506, at a step 1508. Volatile memory is overwritten with correct data at a step 1510, and is powered-down for a known period of time at a step 1512. Volatile memory is read back in step 1514, and the data is compared to known data at a step 1516. At step 1518, if more power-down time periods must be measured, the method returns to step 1510. More time periods may be measured to construct a characterization table, or more time periods may be measured in increasing lengths until the amount of corrupted data exceeds the amount of corrupted data determined in step 1508. Any well-known method of searching for a bound on the amount of corrupted data, including binary search, may provide a sufficiently accurate time estimate for the amount of time that the device was without power.

When a sufficient number of measurements of corrupted data has been made, the method proceeds to a step 1520 during which the amount of time that the device was without power is estimated based upon the amount of corrupted data in the volatile memory. Finally, appropriate action is taken based upon the particular elements used in the device and the amount of time that the power has been off at a step 1522. As set forth above, the estimated time periods may be discarded or stored in a characterization table for later use. If the data is to be stored, additional data may be stored after the time period associated with the amount of corrupted data determined at step 1508 has been reached.

The methods of FIGS. 11-15 may be implemented using any of the circuits of FIGS. 1-10 as described above, or using other suitable circuits and systems.

It can therefore be appreciated that the new and novel circuit for and method of determining a period of time during which a device was without power has been described. It will be appreciated by those skilled in the art that numerous alternatives and equivalents will be seen to exist that incorporate the disclosed invention. As a result, the invention is not to be limited by the foregoing embodiments, but only by the following claims.

What is claimed is:

1. A circuit structure for determining a period of time during which a device was without power, the circuit structure comprising:
   a volatile memory storing known data; and
   a test circuit coupled to the volatile memory, the test circuit determining an amount of incorrect data stored in the volatile memory after the period of time during which the device was without power, wherein the amount of incorrect data is used to determine the period of time during which the device was without power.

2. The circuit structure of claim 1, further comprising:
   a non-volatile memory storing the known data;
   wherein the test circuit comprises a comparator coupled to the volatile memory and the non-volatile memory; and
   a counter indicating a number of incorrect bits stored in the volatile memory.

3. The circuit structure of claim 1, further comprising a memory storing characterization data associated with the volatile memory, the characterization data indicating estimated times for the period of time during which the device was without power based upon the amount of incorrect data.

4. The circuit structure of claim 3, further comprising a second volatile memory storing the known data, wherein the memory storing characterization data associated with the volatile memory further stores characterization data associated with the second volatile memory.

5. The circuit structure of claim 1, further comprising a control circuit coupled to an element of the device, wherein the control circuit controls the operation of the element of the device based upon an estimated time during which the device was without power.

6. The circuit structure of claim 5, further comprising:
   a temperature sensor coupled to the control circuit, the temperature sensor providing a temperature associated with the volatile memory; and
   a memory storing characterization data associated with the volatile memory, the characterization data comprising estimated times for the period of time during which the device was without power for a plurality of temperatures.

7. The circuit structure of claim 1, further comprising a processor having a memory, wherein the test circuit determines a number of incorrect bits stored in the volatile memory using data stored in the memory of the processor.

8. A circuit structure for determining a period of time during which a device was without power, the circuit structure comprising:
   a volatile memory of a device having programmable logic, the volatile memory storing known data;
   a non-volatile memory storing the known data; and
   a test circuit coupled to the volatile memory and the non-volatile memory, the test circuit determining an amount of incorrect data stored in the volatile memory after the period of time during which the device was without power, wherein the amount of incorrect data indicates the period of time during which the device was without power.

9. The circuit structure of claim 8, wherein the non-volatile memory is separate from the device.

10. The circuit structure of claim 8, wherein the known data comprises a block of program code for determining a number of incorrect bits stored in the volatile memory after the period of time during which the device was without power.

11. The circuit structure of claim 8, wherein the test circuit is implemented in the programmable logic of the device having programmable logic.

12. The circuit structure of claim 8, further comprising a processor, wherein the test circuit is implemented by the processor.

13. The circuit structure of claim 8, wherein the test circuit is separate from the device.

14. The circuit structure of claim 8, further comprising a memory storing characterization data associated with the volatile memory, the characterization data indicating estimated times for the period of time during which the device was without power based upon a number of incorrect bits.

15. A method of controlling a device, the method comprising:
storing known data in a volatile memory;
comparing data stored in the volatile memory after a period of time during which the device was without power with the known data;
determining an amount of data stored in the volatile memory having incorrect values;
estimating a period of time during which the device was without power based on the amount of data stored in the volatile memory having incorrect values; and
controlling an element of the device based upon the estimated period of time during which the device was without power.

16. The method of claim 15, wherein storing known data in a volatile memory comprises storing configuration bits associated with programmable logic of the device.

17. The method of claim 15, wherein estimating the period of time during which the device was without power comprises determining an estimated time based upon a comparison of the amount of data stored in the volatile memory having incorrect values with characterization data associated with the volatile memory.

18. The method of claim 15, further comprising determining a temperature for the volatile memory, wherein estimating the period of time during which the device was without power comprises estimating the period of time based upon the determined temperature.

19. The method of claim 15, further comprising storing the known data in a non-volatile memory, wherein comparing the data stored in the volatile memory comprises comparing the known data stored in the non-volatile memory with data in the volatile memory after the period of time during which the device was without power.

20. The method of claim 19, wherein controlling the element of the device comprises altering a start-up sequence of the element of the device.

* * * * *